United States Patent [19]

Ahuja et al.

[11] 4,442,529
[45] Apr. 10, 1984

[54] POWER SUPPLY REJECTION CHARACTERISTICS OF CMOS CIRCUITS

[75] Inventors: Bhupendra K. Ahuja, Sunnyvale, Calif.; Mirmira R. Dwarakanath, Berkeley Heights, N.J.

[73] Assignee: AT&T Bell Telephone Laboratories, Incorporated, Murry Hill, N.J.

[21] Appl. No.: 231,478

[22] Filed: Feb. 4, 1981

[51] Int. Cl.[3] .................... H01L 27/04; H01L 29/78; H04L 3/00
[52] U.S. Cl. .................... 375/34; 307/304; 357/42; 357/84
[58] Field of Search .................... 375/34, 121; 357/42, 357/84, 48, 4 D, 23 C; 307/303, 304

[56] References Cited

U.S. PATENT DOCUMENTS 3,373,323 3/1968 Wolfrum et al. ............ 357/84
4,006,491 2/1977 Alaspa et al. ............ 357/42
4,314,268 2/1982 Yoshioka et al. ............ 357/84

FOREIGN PATENT DOCUMENTS 2850305 5/1979 Fed. Rep. of Germany ........ 357/42

OTHER PUBLICATIONS

RCA COS/MOS Digital Integrated Circuits, Databook #SSD-203, (RCA, Somerville, NJ, 1972) pp. 13, 45, 83; CD4000, 4012, 4019.
Hodges et al., IEEE J. of Solid State Circuits, vol. SC 13, No. 3, Jun. 1978, pp. 285–294.
McCreary, IEEE J. of Solid State Circuits, vol. SC 10 No. 6, Dec. 1975, pp. 371–379.
Electronic Design, Jun. 7, 1980, pp. 109–123.

Primary Examiner—William D. Larkins
Attorney, Agent, or Firm—Lucian C. Canepa

[57] ABSTRACT

In a conventional CMOS integrated circuit such as a switched capacitor filter, power supply noise signals are coupled from the substrate to high impedance nodes via various parasitic capacitances. To minimize these noise signals and thereby improve the power supply rejection ratio of the circuit, only N-channel transistors are coupled to the nodes. Additionally, the P-tubs of these transistors are connected to an on-chip regulated power supply. Moreover, for certain metallic runners and capacitors of the circuit that are connected to the specified nodes and parasitically coupled to the substrate, grounded P-tubs are formed directly under the runners and capacitors.

8 Claims, 5 Drawing Figures

POWER SUPPLY REJECTION CHARACTERISTICS OF CMOS CIRCUITS

BACKGROUND OF THE INVENTION

This invention relates to complementary-metal-oxide-semiconductor (CMOS) integrated circuits and, more particularly, to a CMOS integrated circuit configuration in which the coupling of noise signals to certain nodes thereof is substantially reduced.

Integrated circuits such as switched capacitor filters or analog-to-digital converters having high-impedance summing node points are particularly susceptible to noise signals. If these signals exceed specified levels, the operating characteristics of the circuit will be seriously degraded and the circuit will not be acceptable for inclusion in a high-performance signal processing system such as a single-chip pulse-code-modulation (PCM) coder-decoder (CODEC) with filters.

In practice, various noise signals are parasitically coupled to the aforespecified node points from off-chip supplies and distribution buses connected to the substrate and to so-called tubs formed in the substrate of the CMOS integrated circuit chip. The off-chip supplies can, for example, also be corrupted by noise from certain circuitry (for example digital circuits) on the chip. Accordingly, considerable efforts have been directed by circuit designers at trying to devise techniques for improving the performance characteristics of the chip by reducing the coupling of such noise signals to the node points. Heretofore, however, no simple, economical and effective way of achieving a satisfactory reduction of parasitically coupled power supply noise signals to the indicated node points of a CMOS chip has been devised.

SUMMARY OF THE INVENTION

Hence, an object of the present invention is an improved CMOS integrated circuit. More specifically, an object of this invention is to reduce the coupling of power supply noise signals to certain node points of the CMOS circuit.

Briefly, these and other objects of the present invention are realized in a specific illustrative CMOS integrated circuit chip that comprises an N substrate and P-tubs formed in the substrate. The circuit includes high-impedance node points susceptible to coupling of noise signals. In practice, noise signals are parasitically coupled to the high-impedance nodes from standard off-chip power supplies and distribution buses connected to the substrate and to the tubs. The circuit also includes metallic runners and capacitors connected to the nodes and also parasitically coupled to the substrate.

In accordance with the principles of the present invention, only N-channel transistors are connected to the high-impedance nodes. Additionally, the P-tubs of these transistors are connected to an on-chip regulated voltage source. Moreover, grounded P-tubs are formed directly under the noted runners and capacitors. Coupling of power supply noise signals to the specified nodes of the CMOS circuit is thereby substantially reduced.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
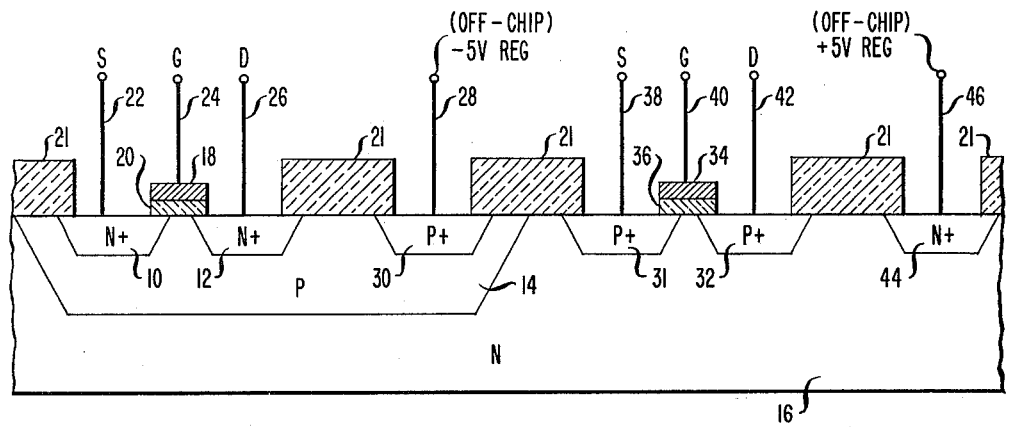
FIGS. 1 and 2 are sectional depictions of different portions of a prior art CMOS integrated circuit chip.

The sectional depiction of FIG. 1 shows a portion of a conventional CMOS semiconductor chip at an intermediate point in its fabrication cycle. As shown, the chip has been processed to include therein both N-channel and P-channel MOS transistors. The N-channel transistor comprises N+ regions 10 and 12 in a P-tub or P-well 14 formed in an N substrate 16. These N+ regions constitute the source and drain regions of the depicted transistor. The N-channel transistor further comprises a gate electrode 18 overlying a thin oxide layer 20. A patterned thick-oxide (field-oxide) layer 21 is also shown in FIG. 1. Electrical connections are made to the source, drain and gate regions of the aforespecified N-channel transistor in a manner well known in the art. In practice, this is done in a conventional way by defining metallization patterns on the integrated circuit chip. In FIG. 1, these connections, which are schematically represented by leads 22, 24 and 26, extend to specified points in the circuit being fabricated.

To avoid forward biasing the P-to-N+ junctions between the P-tub 14 and the N+ regions 10 and 12 of FIG. 1, it is standard practice to connect all the P-tubs in the depicted CMOS structure to the most negative voltage in the circuit. More specifically, the P-tubs are typically connected to the off-chip negative voltage supply utilized to power the CMOS circuitry. (An off-chip positive voltage supply is also typically provided.) Illustratively, the potential of the off-chip negative supply is −5 volts with respect to a point of reference potential such as ground.

A typical way of connecting the off-chip negative supply voltage to the P-tub 14 is indicated in FIG. 1. A standard metallization pattern, which is schematically represented by lead 28, connects a P+ region 30 formed in the P-tub 14 to a contact pad on the CMOS chip. In turn, an electrical connection is made via a distribution bus to the associated off-chip source that supplies −5 volts.

The P-channel transistor of the CMOS structure represented in FIG. 1 comprises P+ regions 31 and 32 which serve as source and drain regions, a gate electrode 34 and a thin oxide layer 36. Electrical connections are made to the source, drain and gate of the transistor, as indicated schematically by leads 38, 40 and 42. Moreover, to avoid forward biasing the N-to-P+ junctions between the N substrate 16 and the P+ regions 31 and 32, it is standard practice to connect the N substrate 16 to the aforementioned off-chip source that supplies +5 volts. As indicated in FIG. 1, this is done by forming an N+ region 44 in the substrate 16 and establishing an electrical connection thereto with a metallization pattern (schematically represented by lead 46).

The above-specified voltages required for the CMOS circuitry are typically supplied from regulated off-chip power sources. Leads or buses extend between the off-chip sources and peripheral connection pads on the CMOS chip. Noise (for example, 60 cycle hum and other tonals, or cross-talk) picked up by these leads is thus directly applied to the P-tubs 14 and the substrate 16 of FIG. 1. The power supply voltages at the tubs are further corrupted by noise generated by digital circuitry on the chip itself. In turn, such noise is coupled to the source-to-drain path of each of the aforespecified N-channel and P-channel transistors depicted in FIG. 1. Coupling occurs via parasitic capacitances that exist across the above-defined P-to-N+ and N-to-P+ junctions of the transistors.

In actual CMOS circuits as heretofore constructed, power supply noise signals of the type specified above are coupled via the indicated transistors to various node points in the CMOS circuitry embodied in the chip represented in FIG. 1. For relatively high impedance nodes, for example the summing node points of a conventional switched capacitor filter formed on the CMOS chip, the noise signals coupled thereto can be the basis for substantially degrading the so-called power supply rejection characteristic of the filter. As a result of the application of such noise signals to the indicated nodes, the performance of the overall system fabricated on the chip may fall below specified standards.

In a conventional CMOS integrated chip, power supply noise signals are also coupled from the N substrate to conductive lines and capacitors included in the overall system. If any of these lines and capacitors are connected to high impedance nodes of the type specified above, the aforedescribed degradation in system performance can occur.

Figure 2:
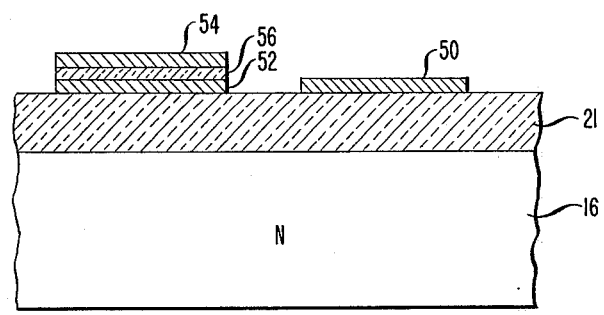

FIG. 2 depicts a specific illustrative conductive runner and capacitor included on the CMOS chip. FIG. 2 illustrates another portion of the same N substrate 16 shown in FIG. 1. Additionally, another region of the previously specified field-oxide layer 21 shown in FIG. 1 is shown in FIG. 2. Formed on top of the layer 21 of FIG. 2 is a conventional patterned metallic line or runner 50 made, for example, of aluminum that is assumed to extend to one of the aforespecified high impedance nodes. Also formed on the layer 21 is a capacitor that comprises, for example, polysilicon layers 52 and 54 having a layer 56 of silicon dioxide therebetween. It is assumed that the specified capacitor is also connected to one of the indicated nodes. Accordingly, noise signals emanating from the off-chip power supply and buses connected to the N substrate 16 are unavoidably coupled to the line 50 and the bottom plate (polysilicon layer 52) of the depicted capacitor. In turn, these noise signals are directly applied to high impedance nodes of the integrated CMOS system, which, as noted above, can substantially degrade the performance of the system.

Applicants' invention is partially based on the recognition that, for certain critical high impedance nodes in the system embodied in the CMOS chip, the signal excursions thereat are such that N-channel transistors alone (without the usual accompanying P-channel units) will function satisfactorily as transmission gates. An illustrative example of such a node is the summing node of a switched capacitor filter included in a single-chip PCM CODEC with filters. Another example of such a high impedance node is the comparator input node in a standard charge-redistribution analog-to-digital converter.

Applicants' invention is further based on the recognition that the signal swings at certain critical nodes is such that the P-to-N+ junctions of the N-channel transistors connected to the nodes can be reliably maintained nonconducting (reverse biased) by connecting to the P-tubs of those transistors a regulated on-chip biasing voltage that is derived from and less than the standard power supply voltages. And, since the N-channel transistors included in the hereinspecified CMOS chip include electrically isolated P-tubs, applicants recognized the opportunity to bias the P-tubs of the transistors connected to the critical nodes at some lower regulated voltage while still being able when needed to bias the P-tubs of other N-channel transistors at the full standard negative voltage (−5 volts).

Figure 3:
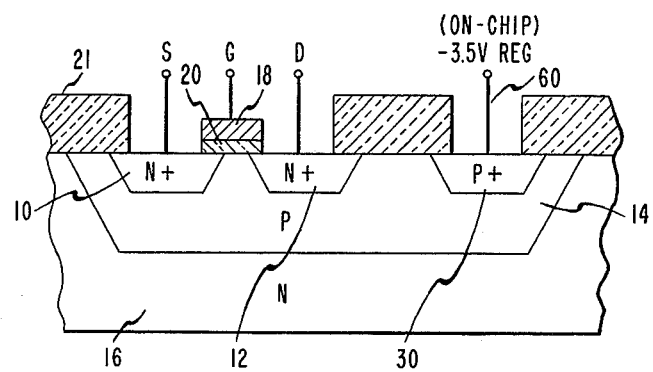
FIGS. 3 and 4 are sectional depictions of the portions shown in FIGS. 1 and 2, respectively, as modified in accordance with the principles of the present invention; and, FIG. 5 shows a specific illustrative regulated power supply configuration of the type included on the CMOS chip in accordance with this invention.

FIG. 3 shows a portion of a CMOS chip that embodies some of the aforespecified features of applicants' invention. The FIG. 3 chip structure is identical to the N-channel-transistor part of the FIG. 1 chip structure. Accordingly, corresponding elements in the two structures are identified by the same reference numerals. The difference between the two depictions is that the FIG. 3 portion does not include a P-channel transistor and, further, that the P-tub 14 of FIG. 3 is connected via lead 60 to an on-chip regulated voltage supply. For purposes of a specific illustrative example, this supply will be assumed to furnish −3.5 volts.

The transistor represented in FIG. 3 is illustrative of the N-channel units connected to the aforespecified critical nodes. As previously stated, no P-channel transistors are connected to those nodes. Importantly, the above-specified regulated supply providing −3.5 volts is adequate in practice to maintain the P-to-N+ junctions shown in FIG. 3 reverse biased under all normal signal operating conditions at the specified nodes.

Figure 5:
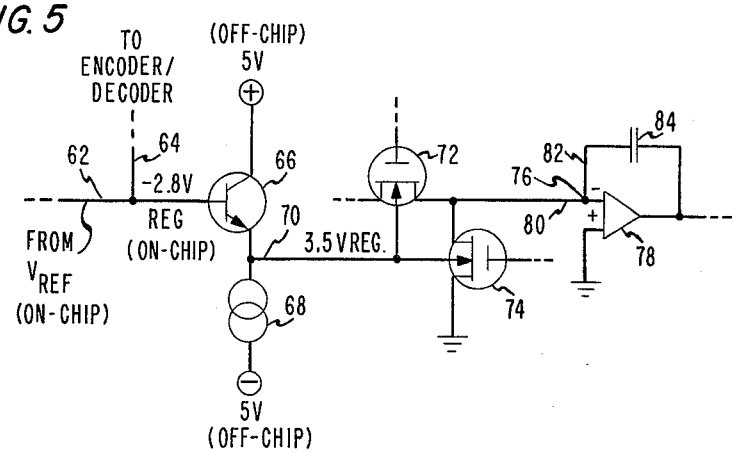

Once the advantage is recognized of fabricating an on-chip regulated supply for biasing the above-specified N-channel transistors, various conventional configurations are known for achieving such a supply. In each case, the on-chip configuration provides a regulated output of approximately −3.5 volts. FIG. 5 depicts a specific illustrative such configuration.

In a typical PCM CODEC chip of the type mentioned herein, it is standard practice to provide an on-chip regulated reference voltage ($V_{REF}$) of, for example, −2.8 volts. That voltage is utilized as a reference source in the encoding and decoding circuitry embodied in the herein-considered CMOS chip, in a manner well known in the art. Such a $V_{REF}$ is indicated in FIG. 5 as being available on lead 62 and as being supplied to the encoder/decoder (via lead 64). $V_{REF}$ is typically not sufficiently negative to itself constitute an adequate source for reliably reverse biasing the aforespecified P-to-N+ junctions.

In accordance with a feature of this invention, the aforespecified −2.8 volts ($V_{REF}$) is also applied to the base of a standard bipolar transistor 66. (Implementing such a bipolar transistor in the herein-considered CMOS technology is straightforward and known in the art.) The collector of the transistor 66 is connected to the previously described standard supply that provides +5 volts. The emitter is connected via a conventional current source 68 to the standard −5 volt supply. (The source 68 may comprise, for example, a 25,000-ohm resistor.) Assuming a base-to-emitter drop of approximately 0.7 volts in the transistor 66, it is apparent, therefore, that a regulated voltage of −3.5 volts is available on lead 70 connected to the emitter of the transistor 66. In practice, the voltage on lead 70 remains relatively invariant despite variations in the standard −5 or +5 volt supplies.

The on-chip regulated voltage appearing on the lead 70 is applied to the P-tubs of N-channel transistors 72 and 74, as schematically indicated in FIG. 5. In turn, these transistors are connected to a high impedance node point 76. Illustratively, the node 76 is one of the input terminals of a standard operational amplifier 78 that constitutes part of a conventional switched capacitor filter formed on the CMOS chip.

As previously described above in connection with FIG. 2, conductive runners and capacitors are also typically connected to critical noise-susceptible node points in the herein-considered CMOS chip. Illustrative such runners connected to the node point 76 are schematically represented by leads 80 and 82 in FIG. 5. A typical such capacitor 84 connected to the node 76 is also shown in FIG. 5.

Figure 4:
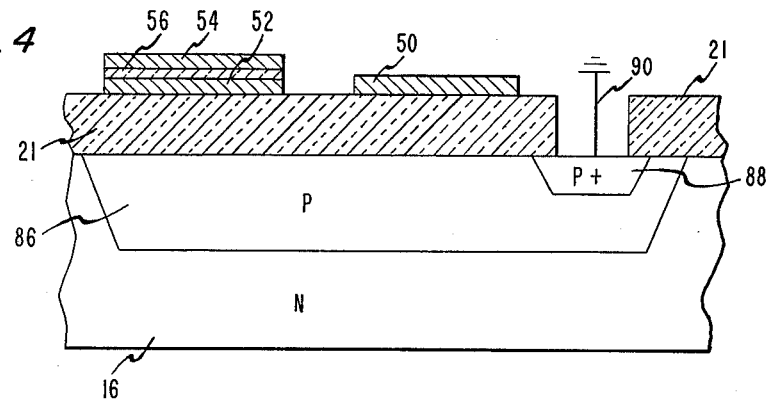

In accordance with a feature of the principles of the present invention, the herein-described CMOS structure is fabricated to include grounded P-tubs under all or at least a portion of those runners and capacitors connected to critical noise-susceptible node points such as the node 76 of FIG. 5. Such a P-tub, designated 86, is shown in FIG. 4. Other elements in FIG. 4 correspond to elements in FIG. 2 and are accordingly designated with the same reference numerals.

The P-tub 86 shown in FIG. 4 has a P+ region 88 formed therein. In turn, the region 88 is connected to ground via a conventional metallization pattern, as schematically indicated by lead 90. As a result, the coupling of power supply noise signals from the substrate 16 to the indicated runner and capacitor shown in FIG. 4 is in practice substantially reduced.

Additionally, to minimize coupling power supply noise signals via the capacitor 84 (FIG. 5) to the node point 76, it is advantageous to arrange the herein-described integrated circuit configuration such that the left-hand plate of the capacitor corresponds to the upper polysilicon layer 54 shown in FIG. 4. In that way, the coupling impedance between the substrate and the node point 76 is maximized and, as a result, the likelihood of coupling unacceptably large noise signals to the point 76 is further reduced.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. In combination in a CMOS integrated circuit that includes both N-channel and P-channel type transistors,
multiple interconnected node points including some each characterized by a relatively high impedance,
and transistors of only one type directly connected to selected ones of said high impedance node points,
wherein said CMOS circuit is formed on a single integrated circuit chip,
wherein each of said transistors connected to said selected high-impedance node points comprises an N-channel transistor each of which comprises
a P-tub formed in an N-substrate, and N+ source and drain regions formed in said P-tub,
and wherein said combination further includes a regulated power supply on said chip for maintaining the P-to-N+ junctions of the N-channel transistors connected to said selected points reverse biased under all circuit operating conditions,
and means connecting the P-tubs of the N-channel transistors connected to said selected points to said regulated supply,
wherein the circuit on said chip includes conductive runners overlying said substrate and connected to high impedance node points,
and wherein said combination further includes P-tubs formed in said substrate under at least some portions of said conductive runners,
and means connecting said last-mentioned P-tubs to a point of reference potential,
said reference potential being different from the output of said regulated supply and more positive than the most negative supply on said chip.

2. In combination in a CMOS integrated circuit that includes both N-channel and P-channel type transistors,
multiple interconnected node points including some each characterized by a relatively high impedance,
and transistors of only one type directly connected to selected ones of said high impedance node points,
wherein said CMOS circuit is formed on a single integrated circuit chip,
wherein each of said transistors connected to said selected high-impedance node points comprises an N-channel transistor each of which comprises
a P-tub formed in an N-substrate, and N+ source and drain regions formed in said P-tub,
and wherein said combination further includes a regulated power supply on said chip for maintaining the P-to-N+ junctions of the N-channel transistors connected to said selected points reverse biased under all circuit operating conditions,
and means connecting the P-tubs of the N-channel transistors connected to said selected points to said regulated supply,
wherein the circuit on said chip includes conductive runners overlying said substrate and connected to high impedance node points,
and wherein said combination further includes P-tubs formed in said substrate under at least some portions of said conductive runners,
and means connecting said last-mentioned P-tubs to a point of reference potential,
wherein the circuit on said chip includes capacitors overlying said substrate and connected to high impedance node points,
and wherein said combination further includes P-tubs formed in said substrate under at least some portions of said capacitors,
and means connecting said last-mentioned P-tubs to said point of reference potential.

3. A combination as in claim 2 wherein said high impedance node points are the summing node points of a switched capacitor filter included on a single-chip PCM CODEC with filters.

4. In a CMOS integrated circuit chip that comprises an N+ substrate and P-tubs formed in said substrate, said circuit including high-impedance nodes susceptible to noise signals parasitically coupled to said nodes from standard off-chip power supplies connected to said substrate and to said tubs, said circuit also including metallic runners and capacitors connected to said nodes and also parasitically coupled to said substrate, wherein the improvement resides in
means comprising only N-channel transistors connected to said nodes, an on-chip regulated power supply responsive to said standard supplies, means connecting the P-tubs of said N-channel transistors to said on-chip supply, P-tubs formed directly under said runners and capacitors, and means connecting said last-mentioned P-tubs to a point of reference potential, whereby the coupling of noise signals from said standard power supplies to said nodes is substantially reduced.

5. In combination in a CMOS integrated circuit fabricated on a semiconductive substrate of one conductivity type, multiple interconnected node points at least some of which are each characterized by a relatively high impedance, conductive members overlying said substrate and connected to some of said high impedance node points, tubs of the other conductivity type formed in said substrate under at least some portions of said conductive members, and means connecting said tubs to a point of reference potential, wherein said substrate comprises an N-substrate, said high impedance node points comprise the summing node points of a switched capacitor filter included on a single-chip PCM CODEC with filters, said tubs comprise P-tubs, and said point of reference potential is ground, wherein only N-channel transistors are connected to said summing node points, each such transistor comprising a P-tub having N+-source and N+-drain regions formed therein.

6. A combination as in claim 5 wherein said chip includes thereon a regulated voltage supply for reverse biasing the P-to-N+ junctions of said N-channel transistors, and means connecting each of said last-mentioned P-tubs to said on-chip supply.

7. In combination in a CMOS integrated circuit fabricated on a semiconductive substrate of one conductivity type, multiple interconnected node points at least some of which are each characterized by a relatively high impedance, capacitors overlying said substrate and connected to some of said high impedance node points, tubs of the other conductivity type formed in said substrate under at least some of said capacitors, and means connecting said tubs to a point of reference potential, wherein said substrate comprises an N-substrate, said high impedance node points comprise the summing node points of a switched capacitor filter included on a single-chip PCM CODEC with filters, said tubs comprise P-tubs, and said point of reference potential is ground, wherein only N-channel transistors are connected to said summing node points, each such transistor comprising a P-tub having N+-source and N+-drain regions formed therein.

8. A combination as in claim 7 wherein said chip includes thereon a regulated voltage supply for reverse biasing the P-to-N+ junctions of said N-channel transistors, and means connecting said last-mentioned P-tubs to said on-chip supply.

* * * * *